(12) United States Patent
Kim et al.

(10) Patent No.: US 11,785,709 B2
(45) Date of Patent: Oct. 10, 2023

(54) ANTENNA MODULE AND ELECTRONIC DEVICE INCLUDING 1HE SAME

(71) Applicant: Samsung Electronics Co., Ltd., Gyeonggi-do (KR)

(72) Inventors: Sungwon Kim, Gyeonggi-do (KR); Youngsik Kim, Gyeonggi-do (KR); Chanyoul Park, Gyeonggi-do (KR); Kisung Bae, Gyeonggi-do (KR); Hongpyo Bae, Gyeonggi-do (KR); Seunggil Jeon, Gyeonggi-do (KR); Youngjun Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 17/368,906

(22) Filed: Jul. 7, 2021

(65) Prior Publication Data
US 2022/0015226 A1    Jan. 13, 2022

(30) Foreign Application Priority Data
Jul. 13, 2020    (KR) .......................... 10-2020-0085883

(51) Int. Cl.
H05K 1/02    (2006.01)
H05K 7/14    (2006.01)
(Continued)

(52) U.S. Cl.
CPC ............. H05K 1/0243 (2013.01); H04B 1/38 (2013.01); H05K 1/111 (2013.01); H05K 5/0017 (2013.01);
(Continued)

(58) Field of Classification Search
USPC .......................... 361/728, 752, 799, 816, 818
See application file for complete search history.

(56) References Cited

U.S. PATENT DOCUMENTS 7,148,846 B2    12/2006    Qi et al.
7,400,300 B2    7/2008    Qi et al.
(Continued)

FOREIGN PATENT DOCUMENTS

CN             208336524 U       1/2019
KR       10-2019-0089375 A       7/2019

OTHER PUBLICATIONS

Galaxy S20+5G/Overview . Advantages/Specs & Services/ Top>Smartphones . Cell Phones>Products>Smartphones>Galaxy S20+5G; 11 pages.
(Continued)

*Primary Examiner* — Hung S. Bui
(74) *Attorney, Agent, or Firm* — Cha & Reiter, LLC

(57) ABSTRACT

An electronic device includes a housing including a first plate, a second plate, and a side member including a first conductive member and a second conductive member which surround a space between the first plate and the second plate and are separated from each other by a slit, a support member interposed in a space between the first plate and the second plate, a PCB, a wireless communication circuit disposed on the PCB, a display, a connection part protruding toward an inner part of the housing from an area of the second conductive member that is adjacent to the slit, the connection part being electrically connected with the second conductive member, and a coupling member coupled to the connection part. The wireless communication circuit is configured to electrically connect the second conductive member and the connection part with an antenna circuit provided on the PCB.

18 Claims, 11 Drawing Sheets

(51) Int. Cl.
   *H05K 1/11* (2006.01)
   *H04B 1/38* (2015.01)
   *H05K 5/00* (2006.01)

(52) U.S. Cl.
   CPC . *H05K 7/1427* (2013.01); *H05K 2201/10053* (2013.01)

(56) References Cited

U.S. PATENT DOCUMENTS

| | | |
|---|---|---|
| 8,018,386 B2 | 9/2011 | Qi et al. |
| 8,836,587 B2 | 9/2014 | Darnell et al. |
| 9,502,752 B2 | 11/2016 | Darnell et al. |
| 9,705,180 B2 | 7/2017 | Darnell et al. |
| 10,015,294 B2 | 7/2018 | Lee et al. |
| 10,297,906 B2 | 5/2019 | Lee et al. |
| 10,516,772 B2 | 12/2019 | Lee et al. |
| 10,658,733 B2 | 5/2020 | Lee et al. |
| 11,050,863 B2 | 6/2021 | Lee et al. |
| 11,101,827 B2 | 8/2021 | Kim et al. |
| 2012/0176278 A1* | 7/2012 | Merz ............... H01Q 1/243 343/702 |
| 2013/0257659 A1* | 10/2013 | Darnell ............ H05K 1/028 343/702 |
| 2018/0076507 A1* | 3/2018 | Heo ................. H01Q 1/243 |
| 2018/0323496 A1 | 11/2018 | Lee et al. |
| 2018/0366812 A1* | 12/2018 | Kim ................. H01Q 1/44 |
| 2019/0036210 A1 | 1/2019 | Kim et al. |
| 2019/0341688 A1* | 11/2019 | Kim ................. H01Q 1/243 |
| 2020/0036820 A1 | 1/2020 | Lee et al. |
| 2021/0135351 A1* | 5/2021 | Son ................. H01Q 5/364 |
| 2022/0052437 A1* | 2/2022 | Lee ................. H01Q 5/371 |
| 2022/0103668 A1* | 3/2022 | Kim ................ H01Q 5/335 |
| 2022/0166867 A1* | 5/2022 | Nam ................ H01Q 9/30 |

OTHER PUBLICATIONS

Japanese 5G Market 'Preoccupation' . . . Strengthen the Offensive . . . Additional Release of Samsungs's Galaxy S20+; 4 pages.
International Search Report dated Oct. 12, 2021.

\* cited by examiner

ANTENNA MODULE AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2020-0085883, filed on Jul. 13, 2020, in the Korean Intellectual Property Office, the disclosure of which is incorporated by reference herein its entirety.

BACKGROUND

1. Field

One or more embodiments of the instant disclosure generally relate to an antenna module and an electronic device including the same.

2. Description of Related Art

As mobile communication technology has developed, electronic devices have been introduced to the market that includes at least one antenna. The electronic device may transmit and/or receive radio frequency (RF) signals such as voice signals or data (e.g., message, photo, moving picture, music file, or game) by using the antenna.

An electronic device may simultaneously transmit or receive signals in different frequency bands, i.e., by using a plurality of frequency bands. The electronic device may provide a service in a global communication band by using the different frequency bands. For example, the electronic device may communicate using signals in a low frequency band (LB) (e.g., global positioning system (GPS); Legacy; WiFi1) and/or communication (e.g., WiFi2) using signals in a high frequency band (HB).

Meanwhile, the electronic device may transmit or receive signals by employing, as the radiator, not only an antenna module disposed inside the housing, but also the housing itself, which includes conductive material. For example, at least a portion of the metal housing included in the electronic device may be electrically connected with a power feeding part, and the power feeding part may transmit signals, which are in various frequency bands, through the portion of the metal housing.

The above information is presented as background information only to assist with an understanding of the disclosure. No determination has been made, and no assertion is made, as to whether any of the above might be applicable as prior art with regard to the disclosure.

SUMMARY

At least one slit may be formed in a portion of the housing so that the housing may be employed as a radiator. For example, a plurality of slits are formed on the side of the housing to separate a portion of the side housing from the other portions of the side housing, such that that portion of the side housing is employed as the radiator. This way, increasing the number of slits may increase the number of radiators. But when an increasing number of radiators are implemented by adding more slits to the housing, the aesthetics of the electronic device may be impaired and the stiffness of the electronic device may be reduced. Conversely, when the number of the slits is limited, the mounting space for the antenna module may also be restricted in a small mobile device. In that case, the electronic device may not be able to simultaneously provide various services in different frequency bands.

Aspects of the disclosure are to address at least the above-mentioned problems and/or disadvantages and to provide at least the advantages described below.

In accordance with an aspect of the disclosure, an electronic device may include a housing including a first plate, which faces a first direction, a second plate which faces a second direction opposite to the first direction, and a side member including a first conductive member and a second conductive member which surrounds a space between the first plate and the second plate and are separated from each other by a slit, a support member interposed between the first plate and the second plate, a printed circuit board (PCB) disposed on a first surface of the support member, a wireless communication circuit disposed on the PCB, a display disposed on a second surface of the support member facing a direction opposite to a direction of the first surface of the support member and exposed through at least a portion of the first plate, a connection part protruding toward an inner part of the housing from an area of the second conductive member that is adjacent to the slit, the connection part being electrically connected with the second conductive member, and a coupling member coupled to the connection part while facing the first surface on which the PCB is disposed. The wireless communication circuit may be configured to electrically connect the second conductive member and the connection part with an antenna circuit included in the PCB.

In accordance with another aspect of the disclosure, an electronic device may include a side housing including a first conductive member and a second conductive member separated from each other by a slit, a PCB, and a wireless communication circuit disposed on the PCB. The second conductive member may include a connection part protruding from an area of the second conductive member that is adjacent to the slit, the connection part being connected with the PCB. The wireless communication circuit may be configured to electrically connect the second conductive member and the connection part with an antenna circuit provided on the PCB.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

In the following description made with respect to the accompanying drawings, similar components will be assigned with similar reference numerals.

DETAILED DESCRIPTION

Figure 1:
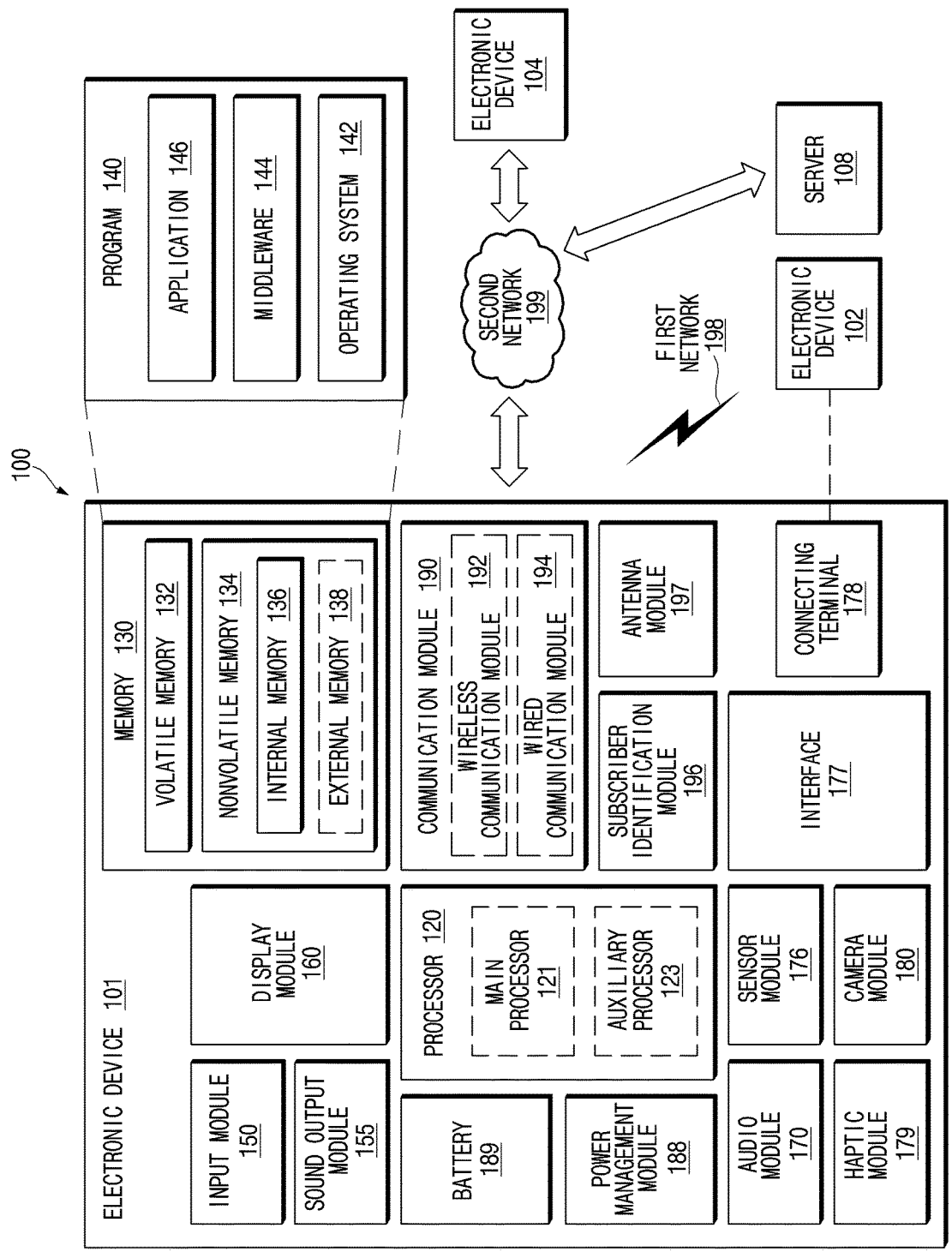
FIG. 1 is a block diagram illustrating an electronic device in a network environment, according to various embodiments.

Hereinafter, various embodiments of the present disclosure will be described in detail with reference to the accompanying drawings. However, it should be understood that the present disclosure is not limited to specific embodiments, but rather includes various modifications, equivalents and/or alternatives of the embodiments of the present disclosure. Regarding description of the drawings, like reference numerals may refer to like elements.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in nonvolatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the nonvolatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beamforming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
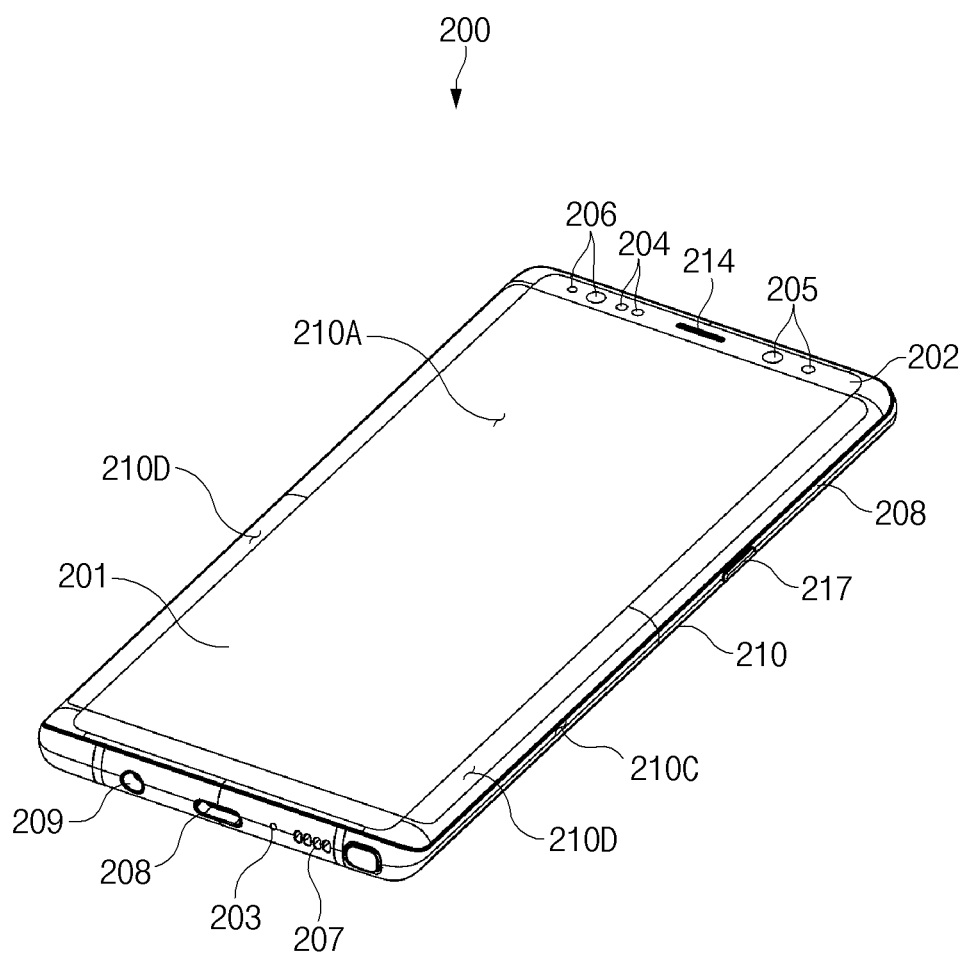
FIG. 2 illustrates a front perspective view of an electronic device, according to an embodiment.
Figure 3:
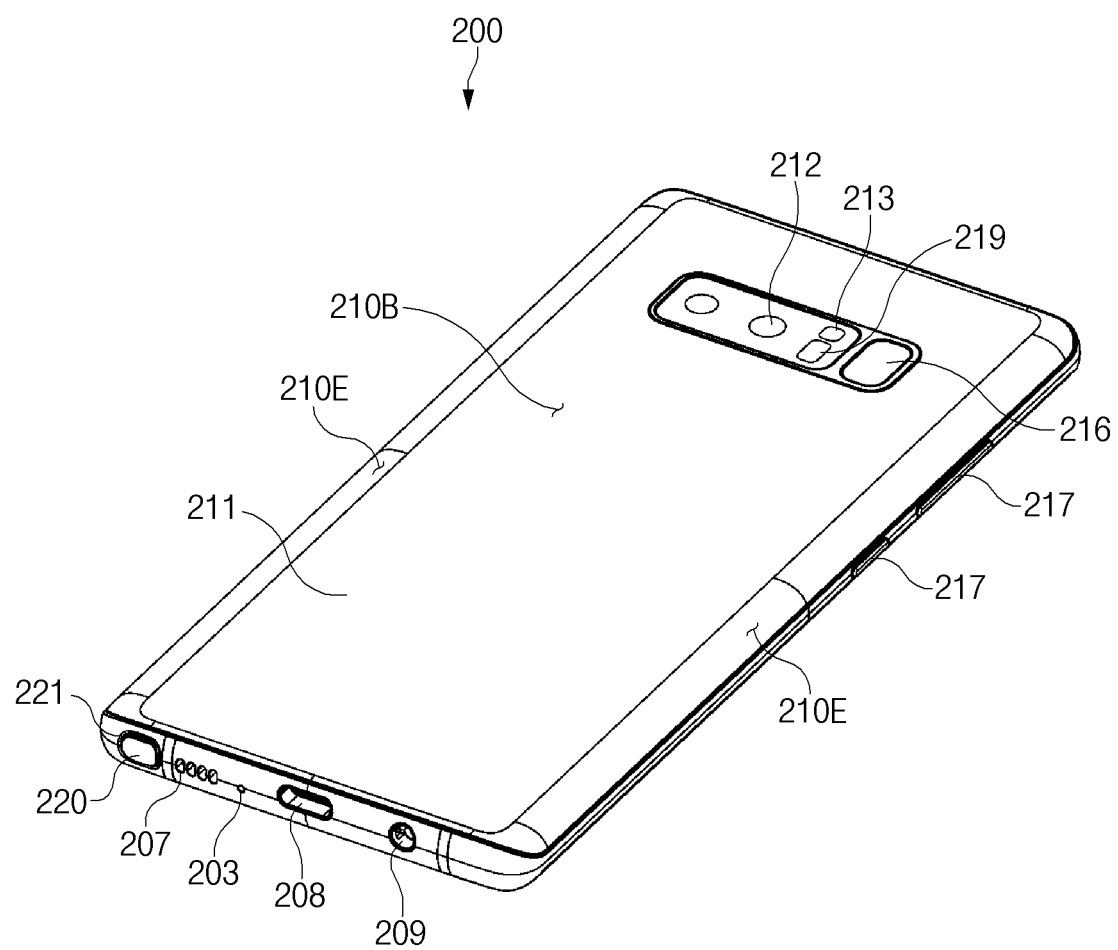
FIG. 3 illustrates a rear perspective view of an electronic device, according to an embodiment.

FIG. 2 illustrates a front perspective view of an electronic device 200 (e.g., the electronic device 101 of FIG. 1), according to an embodiment. FIG. 3 illustrates a rear perspective view of the electronic device 200, according to an embodiment.

Referring to FIGS. 2 and 3, the electronic device 200 according to an embodiment may include a housing 210 including a first surface 210A (or a front surface), a second surface 210B (or a rear surface), and a side surface 210C surrounding the space between the first surface 210A and the second surface 210B. According to another embodiment (not illustrated), a housing may be referred to as the structure forming some of the first surface 210A, the second surface 210B, and the side surface 210C of FIGS. 2-3. According to an embodiment, the first surface 210A may include a front plate 202 (e.g., a glass plate or a polymer plate including various coating layers) having at least a portion that is substantially transparent. The second surface 210B may be implemented by a rear plate 211 that is substantially opaque. The rear plate 211 may include, for example, coating or colored glass, ceramic, polymer, metal (e.g., aluminum, stainless steel (STS), or magnesium) or the combination of at least two of the above materials. The side surface 210C may include a side bezel structure (or a side member) 218 which is coupled to the front plate 202 and the rear plate 211, and includes metal and/or polymer. According to an embodiment, the rear plate 211 and the side bezel structure 218 may be formed integrally with each other and may include the same material (e.g., a metal material such as aluminum).

According to an embodiment, the front plate 202 may include two first areas 210D which are bent toward the rear plate 211 while seamlessly extending from the first surface 210A and are formed at opposite long edge ends of the front plate 202. According to an embodiment illustrated (see FIG. 3), the rear plate 211 may include two second areas 210E which are bent from the second surface 210B toward the front plate 202 while seamlessly extending from the second surface 210B, and are formed at opposite long edge ends of the rear plate 211. According to an embodiment, the front plate 202 (or the rear plate 211) may include only one of the first areas 210D (or the second areas 210E). According to another embodiment, the first areas 210D and/or the second areas 210E may be eliminated at certain portions of the housing. According to this embodiment, when viewed from the side surface of the electronic device 200, the side bezel structure 218 may have a first thickness (or width) at the side surface having no first areas 210D or second areas 210E, and may have a second thickness thinner than the first thickness at the side surface including the first areas 210D or the second areas 210E.

According to an embodiment, at least one antenna radiator (e.g., a conductive pattern) may be disposed at the side member (e.g., the side bezel structure 218 of FIG. 3) of the housing 210 of the electronic device 200, the two first areas 210D which are bent toward the rear plate 211 from the first surface 210A of the front plate 202 while seamlessly extending from the first surface 210A, or the two second areas 210E which are bent toward the front plate 202 from the second surface 210B of the rear plate 211 while seamlessly extending from the second surface 210B.

According to an embodiment, at least one antenna radiator may radiate signals in a specified frequency band. According to an embodiment, at least one antenna radiator may be a sub-radiator. For example, the at least one antenna radiator may radiate a signal, such as "n41", "n78", and/or "n79", in a 5G Sub-6 frequency band ranging from 3.5 GHz to about 6 GHz. In another example, the at least one antenna radiator may radiate signals in a WiFi frequency band. The WiFi frequency band may be one or more frequency bands employed in IEEE 802.11a and/or 802.11b.

According to an embodiment, at least one antenna radiator may be a main radiator. According to an embodiment, the frequency band radiated from the main radiator and the frequency band radiated from the sub-radiator may at least partially overlap.

According to another embodiment, at least one antenna radiator may radiate signals in an mmWave frequency band. For example, the mmWave frequency band may include a frequency band ranging from about 24 GHz to 34 GHz and/or about 37 GHz to 44 GHz. In another example, at least one antenna radiator may radiate a signal in the IEEE 802.11ay frequency band.

According to an embodiment, the electronic device 200 includes at least one of a display 201 (e.g., the display module 160 of FIG. 1), audio modules 203, 207, and 214 (e.g., the audio module 170 of FIG. 1), sensor modules 204, 216, and 219 (e.g., the sensor module 176 of FIG. 1), camera modules 205, 212, and 213 (e.g., the camera module 180 of FIG. 1), a key input device 217, a light emitting device 206, or connector holes 208 and 209. According to an embodiment, the electronic device 200 may omit at least one (e.g., the key input device 217 or the light emitting device 206) of components or may include other components.

The display 201 may be exposed, for example, through a substantial portion of the front plate 202. According to an embodiment, at least a portion of the display 201 may be exposed through the front plate 202 including the first surface 210A and the first areas 210D of the side surface 210C. According to an embodiment, the edge of the display 201 may be formed substantially identically to the shape of an outer portion of the front plate 202 that is adjacent to the edge. According to another embodiment (not illustrated), to expand the area for exposing the display 201, substantially identical distance may be formed between the outer portion of the display 201 and the outer portion of the front plate 202.

According to another embodiment (not illustrated), a recess or an opening may be formed in a portion of the screen display area of the display 201. In addition, at least one of the audio module 214, the sensor module 204, the camera module 205, and the light emitting device 206 may be aligned within the recess or the opening. According to another embodiment (not illustrated), at least one of the audio module 214, the sensor module 204, the camera module 205, the fingerprint sensor 216, or a light emitting device 206 may be included in a rear surface of the screen display area of the display 201. According to yet another embodiment (not illustrated), the display 201 may be coupled or disposed adjacent to a touch sensing circuit, a pressure sensor to measure the intensity (pressure) of a touch, and/or a digitizer to detect the stylus pen based on an electromagnetic scheme. According to an embodiment, at least some of the sensor modules 204 and 219 and/or at least a portion of the key input device 217 may be disposed in the first areas 210D and/or the second areas 210E.

The audio modules 203, 207, and 214 may include the microphone hole 203 and speaker holes 207 and 214. The microphone hole 203 may have a microphone disposed inside the microphone hole 203 to obtain an external sound. According to an embodiment, a plurality of microphones may be provided to sense the direction of a sound. The speaker holes 207 and 214 may include the external speaker hole 207 and the receiver hole 214 for conversation. According to an embodiment, the speaker holes 207 and 214 and the microphone hole 203 may be realized in the form of one hole or a speaker may be included without the speaker holes 207 and 214 (e.g., a piezoelectric speaker).

The sensor modules 204, 216, and 219 may generate electrical signals or data values corresponding to an internal operating state or an external environment state of the electronic device 200. The sensor modules 204, 216 and 219 may, for example, include the first sensor module 204 (e.g., a proximity sensor) and/or the second sensor module (not illustrated; e.g., a fingerprint sensor) disposed on the first side surface 210A of the housing 210, and/or the third sensor module 219 (e.g., a heart-rate monitor (HRM) sensor) and/or the fourth sensor module 216 (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include a sensor module (not illustrated), such as at least one of a gesture sensor, a gyro sensor, an air pressure sensor, a magnetic sensor, an acceleration sensor, a grip sensor, a color sensor, an infrared sensor, a biometric sensor, a temperature sensor, a humidity sensor, or the illuminance sensor 204.

The camera modules 205, 212 and 213 may include the first camera device 205 disposed on the first surface 210A of the electronic device 200 and the second camera device 212 and/or the flash 213 disposed on the second side surface 210B of the electronic device 200. The camera devices 205 and 212 may include one or a plurality of lenses, an image sensor, and/or an image signal processor. The flash 213 may include, for example, a light emitting diode or a xenon lamp. According to an embodiment, two or more lenses (infrared camera, a wide angle lens, and a telephoto lens) and image sensors may be disposed on one side surface of the electronic device 200.

The key input device 217 may be disposed on the side surface 210C of the housing 210. According to another embodiment, the electronic device 200 may not include some or an entire portion of the key input device 217 and the some or the entire portion of the key input device 217 not included may be implemented in another form such as a soft key on the display 201. According to another embodiment, the key input device 217 may include the sensor module 216 disposed on the second surface 210B of the housing 210.

The light emitting device 206 may be, for example, disposed on the first surface 210A of the housing 210. The light emitting device 206 may provide, for example, the state information of the electronic device 200 in an optical form. According to another embodiment, the light emitting device 206 may provide, for example, a light source operating together with the operation of the camera module 205. The light emitting device 206 may include, for example, an LED, an IR LED, and a Zenon lamp.

The connector holes 208 and 209 may include the first connector hole 208 to receive a connector (e.g., a USB connector) to transmit or receive power and/or data together with the external electronic device and the second connector hole (e.g., an ear-phone jack) 209 to receive a connector to transmit or receive an audio signal together with the external electronic.

Figure 4:
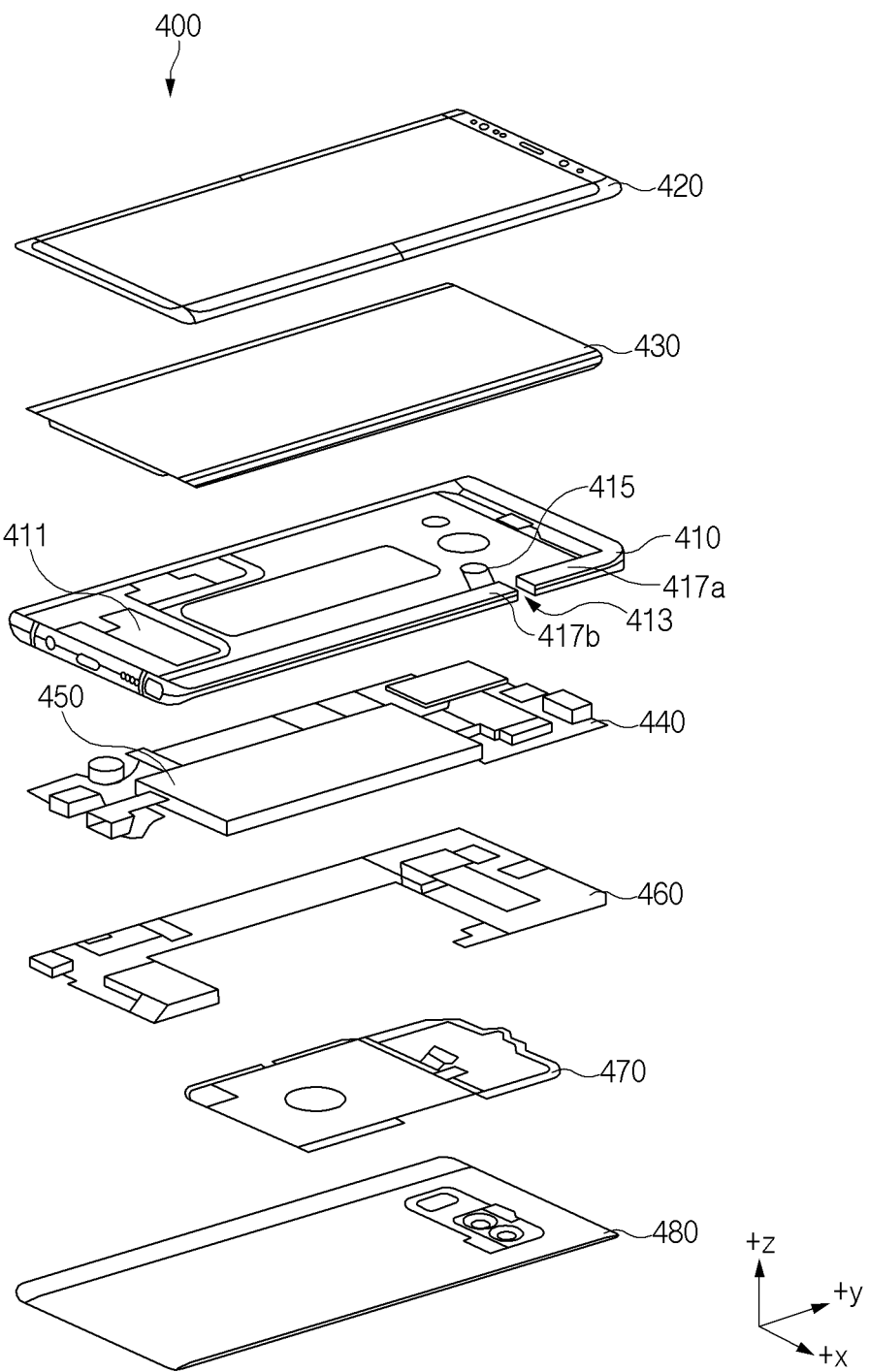
FIG. 4 illustrates an exploded perspective view of an electronic device, according to an embodiment.

FIG. 4 is an exploded perspective view 400 of an electronic device (e.g., the electronic device 200 of FIG. 2 and/or FIG. 3), according to an embodiment. Referring to FIG. 4, the electronic device 200 may include a side bezel structure 410 (e.g., the side bezel structure 218 of FIG. 2), a first support member 411 (e.g., a bracket), a front plate 420, a display 430 (e.g., the display 201 of FIG. 1), a printed circuit board (PCB) 440, a battery 450, a second support member 460 (e.g., a rear case), a near-field antenna 470, and a rear plate 480 (e.g., the rear plate 211 of FIG. 3). According to an embodiment, the electronic device 200 may omit at least one (e.g., the first support member 411 or the second support member 460) of components or may additionally include other components. At least one of components of the electronic device 200 may be identical to or similar to at least one of components of the electronic device 200 of FIG. 2 or FIG. 3, and the duplicated description thereof will be omitted.

The side bezel structure 410 may include one or more conductive members (e.g., the first conductive member 417a and the second conductive member 417b) which surround a space between the front plate 420 and the rear plate 480 of the electronic device 200, and are separated from each other by a slit 413. The side bezel structure 410 may further include a connection part 415 protruding toward an inner part of the housing from an area of the second conductive member 417b that is adjacent to the slit 413. The connection part 415 may further be electrically connected with the second conductive member 417b. The connection part 415 may include a coupling member (e.g., a screw) coupled in +Z axis direction. Although FIG. 4 illustrates only one slit, the disclosure is not limited thereto. For example, the side bezel structure 410 may further include a plurality of slits (not illustrated). The side bezel structure 410 may further include conductive members separated from each other by the plurality of slits. Accordingly, the connection part, which protrudes toward the inner part of the housing from at least one of the conductive members, may be further included. The details of the conductive members separated from each other by the plurality of slits and the connection parts additionally further included will be described later with reference to FIG. 9.

The first support member 411 may be disposed between the front plate 420 and the rear plate 480. The first support member 411 may be disposed inside the electronic device 200 to be connected to the side bezel structure 410 or may be integrally formed with the side bezel structure 410. The first support member 411 may be formed of, for example, a metal material and/or a non-metal (e.g., polymer) material. The display 430 may be disposed on the first surface (e.g., the surface facing the +Z axis direction) of the first support member 411 and the PCB 440 may be disposed on the second surface (e.g., the surface facing the −Z axis direction) facing a direction opposite to the direction of the first surface.

The PCB 440 may have a processor (e.g., the processor 120 of FIG. 1), a memory (e.g., the memory 130 of FIG. 1), an interface (e.g., the interface 177 of FIG. 1), and a wireless communication circuit (e.g., the wireless communication module 192 of FIG. 1), an antenna circuit, a plurality of passive element and/or a switching circuit. The processor 120 may include, for example, at least one of a central processing unit (CPU), an application processor (AP), a graphic processing unit (GPU), an image signal processor (ISP), a sensor hub processor (SHP), or a communication processor (CP). The memory may include, for example, a volatile memory or a nonvolatile memory. The interface may include, for example, a high definition multimedia interface (HDMI), a universal serial bus (USB) interface, an SD card interface, and/or an audio interface. The interface may electrically or physically connect the electronic device 200 to an external electronic device (e.g., the electronic devices 102 and 104 of FIG. 1), and may include a USB connector, an SD card/MMC connector, or an audio connector. The wireless communication circuit may be a radio frequency integrated circuit (RFIC). For example, the wireless communication circuit may be configured to electrically connect at least some (e.g., the second conductive member 417b and the connection part 415) of the side bezel structure 410 with an antenna circuit provided on the PCB 440. The plurality of passive devices may include, for example, at least one of an inductor or a capacitor. At least some of the plurality of passive devices may be electrically connected with the connection part 415, and may correspond to a ground area for the connection part 415. The switching circuit, for example, may be electrically connected with the plurality of passive devices and the connection part 415. The switching circuit may perform an operation of changing an electrical connection structure by connecting mutually different passive devices depending on an antenna resonance frequency required in the process in which the antenna module operates.

The battery 450 may include a device to supply power to at least one component of the electronic device 200, for example, a non-rechargeable primary battery, a rechargeable secondary battery, or a fuel cell. At least a portion of the battery 450 may be on the substantially same plane as a plane of the PCB 440. The battery 450 may be disposed inside the electronic device 200 integrally with the electronic device 200, and may be disposed detachably from the electronic device 200.

The near-field antenna 470 may be interposed between the rear plate 480 and the battery 450. The near-field antenna 470 may include, for example, a near-field communication (NFC) antenna, a wireless charging antenna, and/or a magnetic secure transmission (MST) antenna. The near-field antenna 470 may make short range communication with an external device or may wirelessly transmit or receive power necessary for charging. According to another embodiment, an antenna structure may be formed by a portion of the side bezel structure 410 and/or the first support member 411 or the combination of the side bezel structure 410 and the first support member 411. For example, the wireless communication circuit may be configured to electrically connect at least some (e.g., the second conductive member 417b)) of the side bezel structure 410 and the connection part 415 with an antenna circuit provided on the PCB 440. Hereinafter, various antenna structures of the electronic device will be described.

Figure 5:
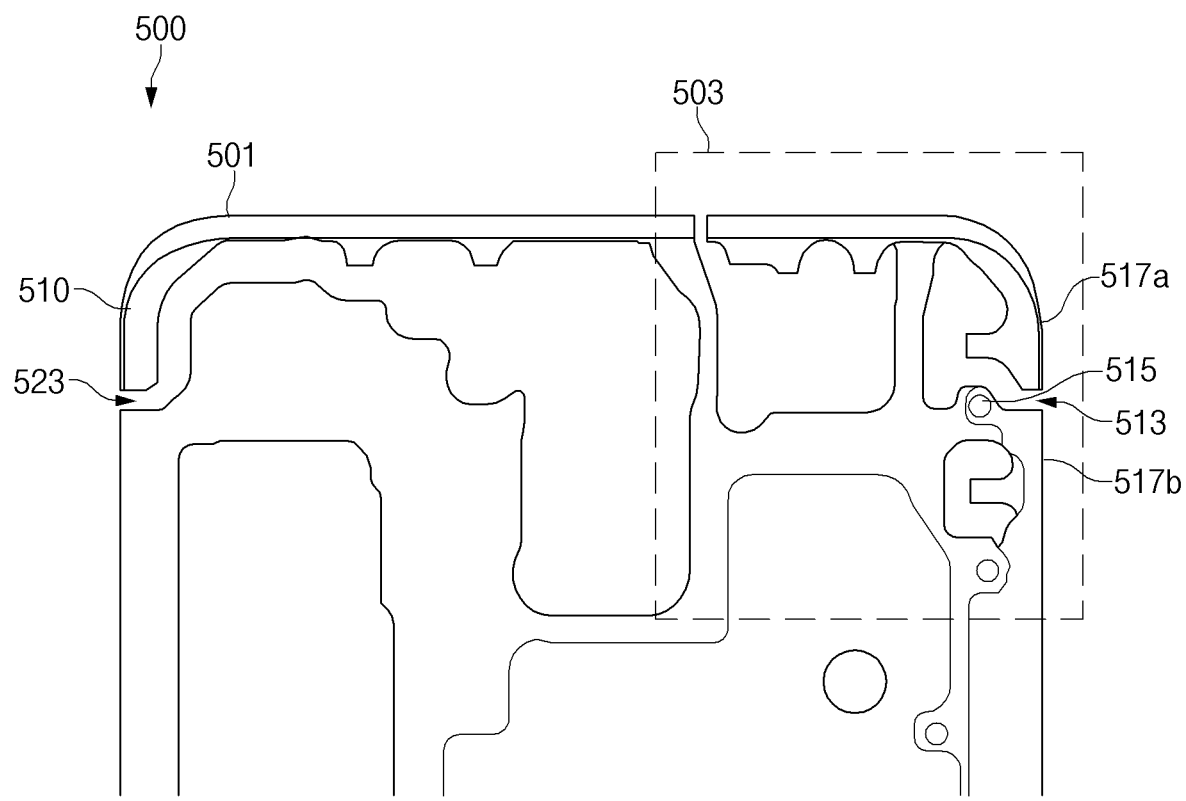
FIG. 5 illustrates a structure of an electronic device including a connection part, according to an embodiment.

FIG. 5 illustrates a structure 500 of an electronic device including a connection part, according to an embodiment.

Referring to FIG. 5, an electronic device 501 (e.g., the electronic device 101 of FIG. 1) may include a side member 510 (e.g., the side bezel structure 410 of FIG. 4). FIG. 5 is a view illustrating one surface of the side member 510 when viewed from a second direction (e.g., the −Z axis direction).

Referring to one area of the side member 510 corresponding to reference numeral 503 of FIG. 5, according to an embodiment, the electronic device 501 may employ, as an antenna, a plurality of conductive members formed in at least one area of the side member 510 and one area protruding from at least one area of the side member 510. For example, the plurality of conductive members formed in at least one area of the side member 510 may refer to areas divided based on a gap area (e.g., a slit 513) included in the side member 510. The one area protruding from at least one area of the side member 510 may refer to one area protruding from at least some of the areas divided based on the gap area included in the side member 510. In other words, the conductive member and the one area protruding from the at least one area of the side member 510 may be components formed integrally with the side member 510 to correspond to a part of the side member 510.

According to an embodiment, the side member 510 may include one or more conductive members 517a and 517b (e.g., the first conductive member 417a and the second conductive member 417b of FIG. 4), which surround the space between the first plate (e.g., the front plate 420 of FIG. 4) and the second plate (e.g., the rear plate 480 of FIG. 4), and are separated from each other by the slit 513 (e.g., the slit 413 of FIG. 4). The side member 510 may further include a connection part 515 protruding toward an inner part of the housing from an area of the second conductive member 517b that is adjacent to the slit 513, and the connection part 515 is electrically connected with the second conductive member 517b. The connection part 515 may include a coupling member (e.g., a screw) coupled in the +Z axis direction. Although FIG. 5 illustrates only one slit (e.g., the slit 513), the disclosure is not limited thereto. For example, the side member 510 may further include at least one slit (e.g., the second slit 523; a second slit 923, a third slit 933, and/or a fourth slit 943 of FIG. 9). The side member 510 may further include conductive members separated from each other through a plurality of slits. Accordingly, the side member 510 may further include a plurality of connection parts (e.g., a second connection part 925, a connection part 935, and/or a fourth connection part 945 of FIG. 9) protruding toward the inner part of the housing from at least one of the conductive members. The details of the conductive members separated from each other through the plurality of slits and the connection parts additionally further included will be described later with reference to FIG. 9.

Hereinafter, an expanded view of the area corresponding to reference numeral 503 will be described in more detail with reference to FIG. 6.

Figure 6:
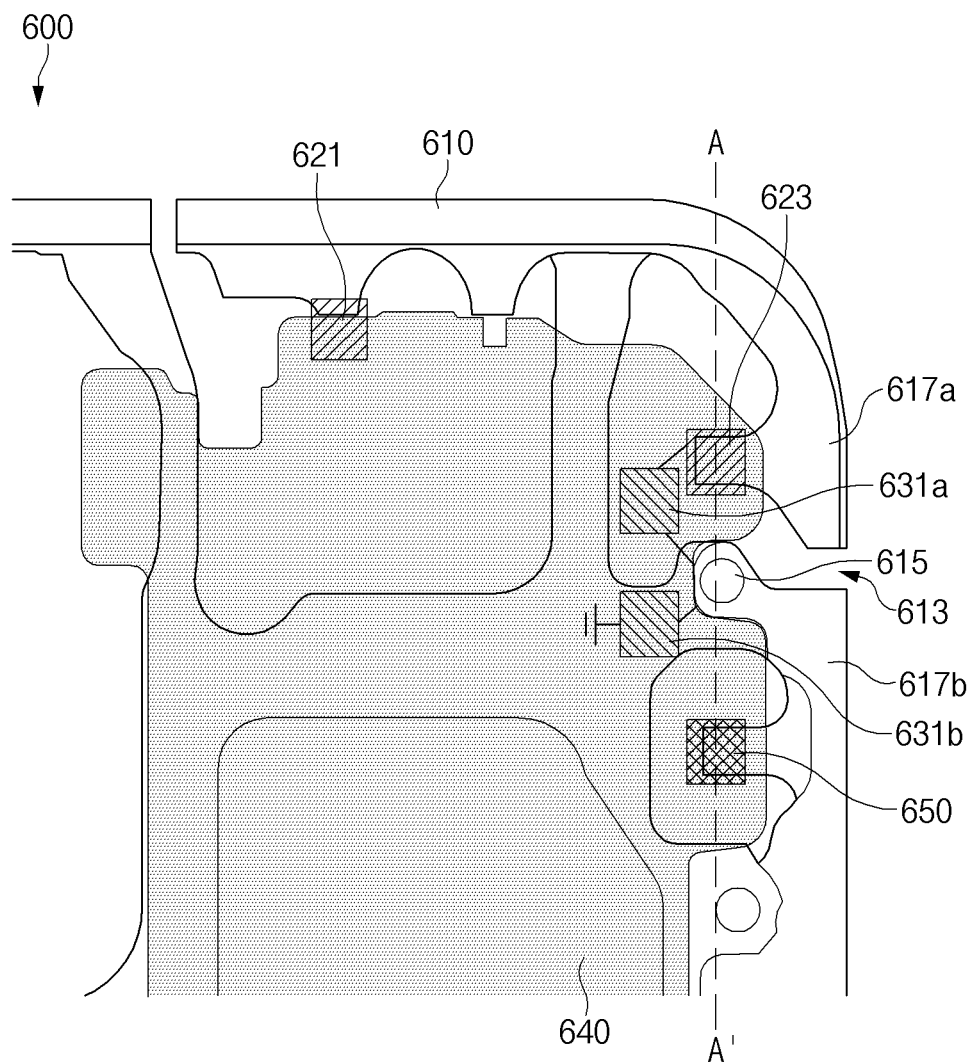
FIG. 6 illustrates a structure of an electronic device including a connection part, according to an embodiment.

FIG. 6 illustrates a structure 600 of an electronic device including a connection part, according to an embodiment.

Referring to FIG. 6, the electronic device (e.g., the electronic device 101 of FIG. 1) may include a side member 610 (e.g., the side bezel structure 410 of FIG. 4). FIG. 6 illustrates one area of the side member 610 corresponding to reference numeral 503 of FIG. 5 when viewed from the second direction (e.g., the −Z axis direction).

According to an embodiment, the side member 610 may include one or more conductive members 617a and 617b (e.g., the first conductive member 417a and the second conductive member 417b of FIG. 4) which are separated from each other by a slit 613 (e.g., the slit 413 of FIG. 4). According to an embodiment, the first conductive member 617a and the second conductive member 617b may include conductive patterns formed in at least one area of the conductive member 617a and the second conductive member 617b that are created via laser direction structuring (LDS). The side member 610 may further include a connection part 615 protruding toward an inner part of the housing from an area of the second conductive member 617b that is adjacent to the slit 613, and the connection part 615 may be electrically connected with the second conductive member 617b. The connection part 615 may be electrically connected with the first conductive member 617a through a power feeding part 623. At least a portion of the connection part 615 may be formed of a metal, such as a copper (Cu) alloy. A coupling member (e.g., screw) may be coupled to the connection part 615 while facing in the +Z axis direction. The coupling member may be screw-tightened with the connection part 615 in the first direction (e.g., a +Z axis direction).

According to an embodiment, the side member 610 may include at least one support member (e.g., the first support member 411 of FIG. 4) formed in the side member 610. For example, a PCB 640 may be disposed on a first surface (e.g., a surface facing the −Z axis direction of the support member) of the support member. For another example, a display (e.g., the display 430 of FIG. 4) exposed through at least a portion of a front plate (e.g., the front plate 420 of FIG. 4) may be disposed on a second surface (e.g., a surface facing the +Z axis direction of the support member) facing the direction opposite to the direction of the first surface of the support member.

According to an embodiment, a wireless communication circuit (not illustrated), a plurality of passive devices 631a and 631b, a switch (not illustrated), power feeding parts 621 and 623, and/or a grounding part 650 may be disposed on the PCB 640.

The wireless communication circuit may feed power into one or more conductive member 617a and/or 617b included in the electronic device. For example, the first power feeding part 621 included in the wireless communication circuit may feed power into a first point of the first conductive member 617a. The second power feeding part 623 may feed power into a second point of the first conductive member 617a and the connection part 615. For example, the second point may be positioned to be adjacent to a first end of the first conductive member 617a that is adjacent to the slit 613, and the first point may be positioned to be adjacent to a second end of the first conductive member 617a opposite to the first end. The plurality of passive devices 631a and 631b may be disposed on a path in which the second power feeding part 623 feeds power into the connection part 615. For example, the plurality of passive devices 631a and 631b may be referred to as matching circuits for the first conductive member 617a and/or the second conductive member 617b.

For example, the passive device 631a electrically connected with the first conductive member 617a and the connection part 615 may be referred to as a first matching circuit. Similarly, the passive device 631b electrically connected with the second conductive member 617b and the connection part 615 may be referred to as a second matching circuit. The plurality of passive devices 631a and 631b may include, for example, one or more inductors and/or capacitors. At least some of the plurality of passive devices 631a and 631b may be electrically connected with the connection part 615 and allows the connection part 615 to be grounded. In another example, the connection part 615 may be electrically connected with a grounding part 650, which in turn is electrically connected with a point of the second conductive member 617b. As such, the connection part 615 may be grounded by the grounding part 650. The switching circuit, for example, may be disposed on the PCB and may be electrically connected with the plurality of passive devices and the connection part 615. The switching circuit may perform an operation of changing the electrical connection structure by connecting different passive devices depending on the antenna resonance frequency required for a particular antenna operation. For example, the wireless communication circuit may selectively connect the connection part 615 with the first matching circuit 631a or the second matching circuit 631b through the switching circuit. The structure of the electronic device including the switching circuit will be described later with respect to FIG. 10.

Although FIG. 6 illustrates a plurality of passive devices 631a and 631b, the embodiments of the disclosure are not limited thereto. For example, the electronic device may include at least one active device, instead of a passive device. For another example, the electronic device may include only one passive device.

Figure 7:
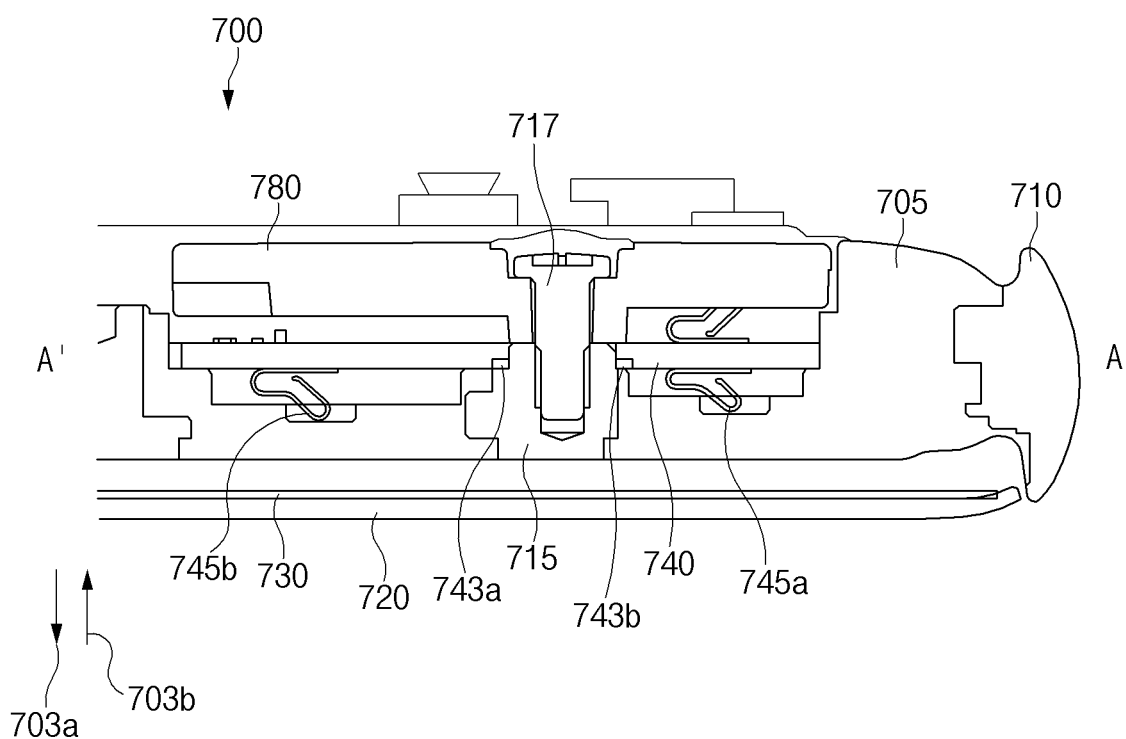
FIG. 7 illustrates a stack structure of an electronic device including a connection part, according to an embodiment.

FIG. 7 is a cross-sectional view 700 of an electronic device including a connection part, according to an embodiment.

FIG. 7 illustrates the cross-sectional view 700 taken from a point A to a point A' illustrated in FIG. 6. Referring to FIG. 7, the electronic device (e.g., the electronic device 101 of FIG. 1) may have a stack structure in which various components are included in the housing. In this case, the housing may include a first plate 720 (or the front plate 420 of FIG. 4) facing the first direction 703a (e.g., the +Z axis direction of FIG. 4), a second plate 780 (e.g., the rear plate 480 of FIG. 4) facing a second direction 703b which is opposite to the first direction 703a, and a side member 710 (e.g., the side bezel structure 410 of FIG. 4) including conductive members which surround the space between the first plate and the second plate and are separated from each other by a slit.

According to an embodiment, the electronic device may include a connection part 715 protruding toward an inner part of the housing from an area of one of conductive members that is adjacent to the slit, where the conductive members are separated from each other by the slit (e.g., the slit 613 of FIG. 6). At least a portion of one end of the connection part 715 that is facing at least the first direction (e.g., +z axis direction) and/or at least a portion of another end of the connection part 715 that is facing at least the second direction may be made with copper (Cu) alloy. In another example, the connection part 715 may include an anodizing film area formed on at least a part of the surface of the connection part 715. The details of the ingredients and the surface of the connection part 715 may be will be described in more detail later with reference to FIG. 8.

According to an embodiment, the electronic device may further include a coupling member 717 formed inside the housing. For example, the coupling member 717 may be coupled to the connection part 715 while facing the first direction 703*a*. The coupling member 717 may be a screw, and may be screw-tightened with the connection part 715 in the first direction 703*a*. As the coupling member 717 is tightened, a PCB 740 disposed on a support member 705 may be fixed. For example, the support member 705 is physically coupled to an area of the side member 710, and the coupling member 717 is coupled to the connection part 715 such that the PCB is fixed on the support member 705.

According to an embodiment, the support member 705 may be interposed in a space between the first plate 720 and the second plate 780. The support member 705 may be disposed inside the electronic device to be connected to the side member 710 or may be integrally formed with the side member 710. The support member 705 may be formed of, for example, a non-metal (e.g., polymer) material. A display 730 may be disposed on the first surface (e.g., the surface facing the first direction 703*a*) of the support member 705 and the PCB 740 may be disposed on the second surface (e.g., the surface facing the second direction 703*b*) facing a direction opposite to the direction of the first surface.

According to an embodiment, pads 743*a* and 743*b* having a copper (Cu) pattern may be formed on at least a portion of an area of the PCB 740 that is making contact with the connection part 715. The antenna circuit provided on the PCB 740 may be electrically connected with a conductive member through the pads 743*a* and 743*b* having the copper (Cu) pattern. According to an embodiment, the PCB 740 may be electrically connected with one or more conductive elastic structures 745*a* and 745*b*. For example, the PCB 740 may be electrically connected with a power feeding part (e.g., the power feeding part 623 of FIG. 6) through one or more conductive elastic structures 745*a* and 745*b* and/or a grounding part (e.g., the grounding part 650 of FIG. 6). The conductive elastic structures 745*a* and 745*b* may be implemented as a c-clip, a pogo pin, and/or the like.

Figure 8:
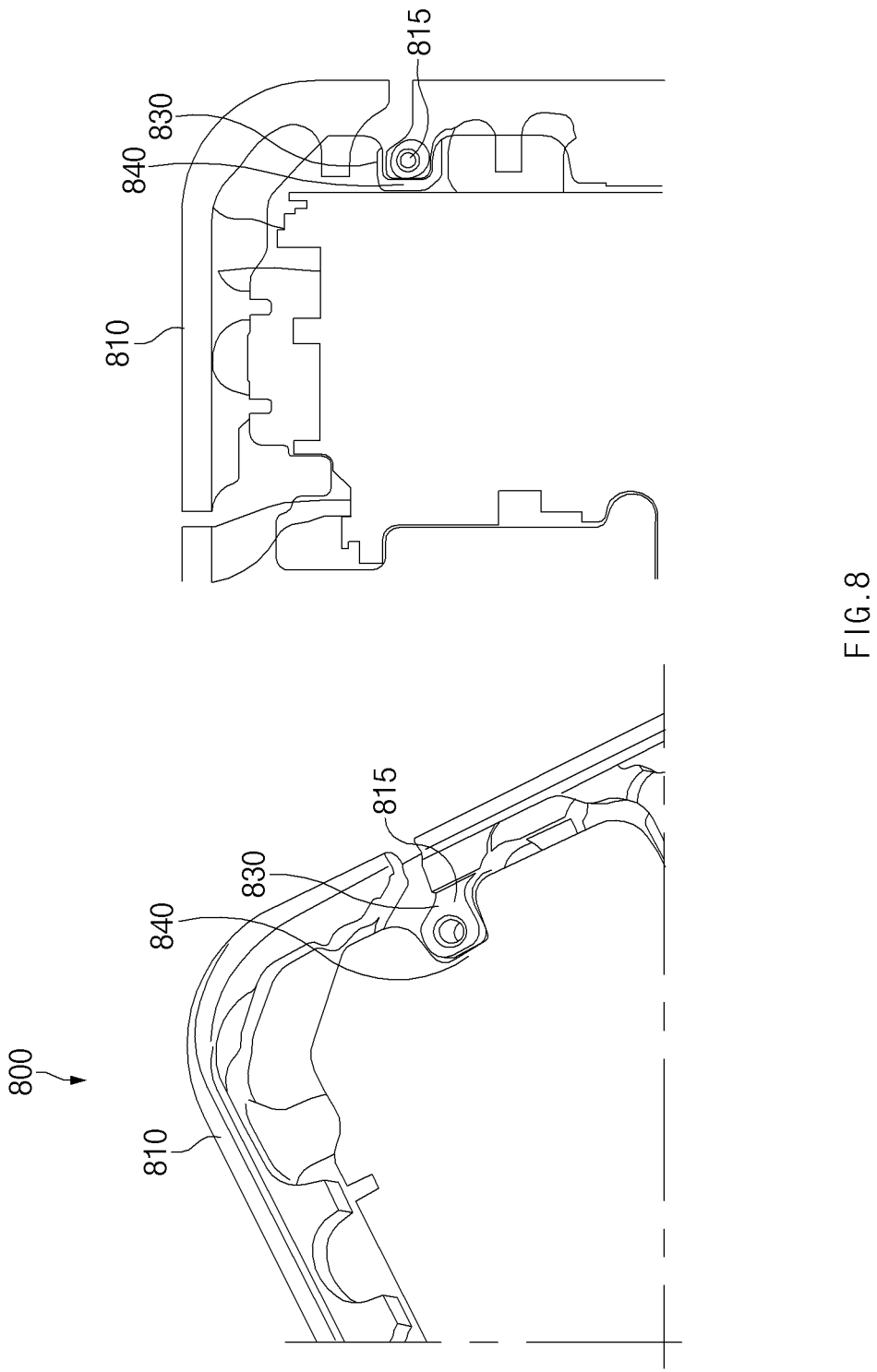
FIG. 8 illustrates a structure of an electronic device including a connection part, according to an embodiment.

FIG. 8 illustrates a structure of an electronic device including a connection part, according to an embodiment.

According to an embodiment, a connection part 815 may include an anodizing film area 830 formed on at least a part of the surface of the connection part 815. The anodizing film area may be coated with an anodized aluminum film. For example, when the anodizing film area 830 is included in one area (e.g., an area coupled to the PCB) of the connection part 815, the connection part 815 may be AC-coupled to a second conductive member (e.g., the second conductive member 617*b* of FIG. 6). As the surface of the connection part 815 is anodized, the connection part 815 may be electrically separated from the PCB such that the connection part 815 operates as a floating ground. The anodized surface of the connection part 815 may protect the components from external impact, and the corrosion resistance of the connection part 815 may be improved. In another example, when the anodizing film area 830 is not included in the connection part 815, the connection part 815 may be DC-coupled to the second conductive member.

According to an embodiment, a pad (e.g., the pads 743*a* and 743*b* of FIG. 7) including copper (Cu) pattern may be formed on at least a portion 840 of the PCB that makes contact with the connection part 815. For example, the antenna circuit provided on the PCB may be electrically connected with the connection part 815 through the pad having the copper (Cu) pattern formed on the PCB. The connection part 815 may be electrically connected with the second conductive member. Accordingly, the PCB may be electrically connected with the second conductive member using the pad having the copper (Cu) pattern.

Figure 9:
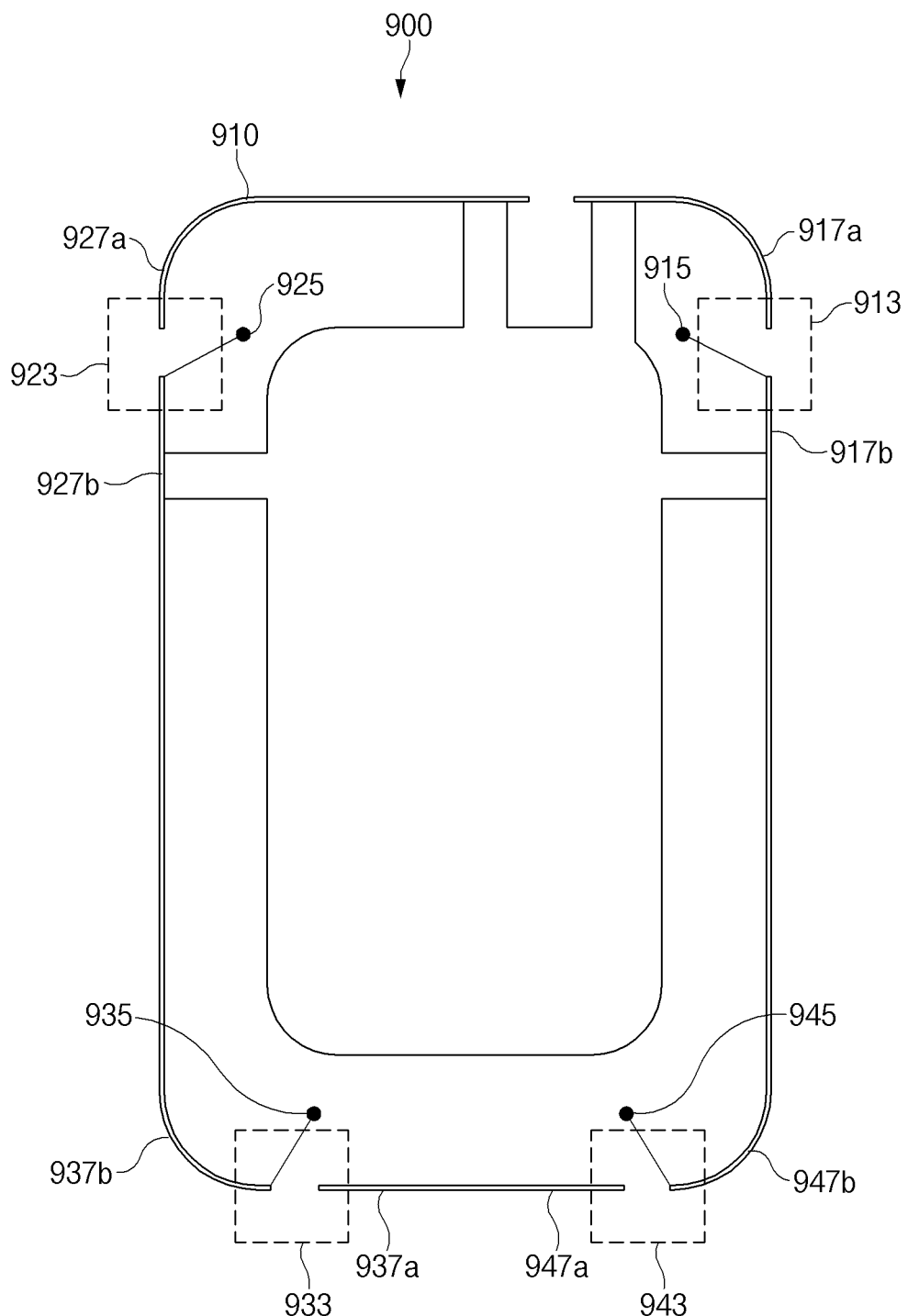
FIG. 9 illustrates a structure of an electronic device including a plurality of slits, according to an embodiment.

FIG. 9 illustrates a structure of an electronic device including a plurality of slits, according to an embodiment.

According to an embodiment, the electronic device (e.g., the electronic device 101 of FIG. 1) may include one or more slits 913, 923, 933, and 943 formed in a side member 910 (e.g., the side member 410 of FIG. 4). Each one of the areas of the side member 910 separated from each other by one or more slits 913, 923, 933, and 943 may serve as a conductive member.

According to an embodiment, the side member 910 may include the first slit 913 (e.g., a slit 613 in FIG. 6), the second slit 923, the third slit 933, and the fourth slit 943. Although FIG. 9 illustrates the total of four slits, the disclosure is not limited thereto. For example, the side member 910 may include only some of the first to fourth slits 913, 923, 933, and 943. Meanwhile, the description of the conductive members separated from each other by the first slit 913 may be understood by making reference to the description made with reference to FIGS. 5 and 6, and the details thereof will be omitted below.

According to an embodiment, the side member 910 may include a third conductive member 927*a* and a fourth conductive member 927*b* separated from each other by the second slit 923. The separation between the third conductive member 927*a* and the fourth conductive member 927*b* may be a separation between logical areas determined based on the third slit 933. According to an embodiment, the side member 910 may further include the second connection part 925 protruding toward the inner part of the housing from one area of the third conductive member 927*a* or the fourth conductive member 927*b*. For example, the second connection part 925 may protrude toward the inner part of the housing from an area of the fourth conductive member 927*b* that is adjacent to the second slit 923, and may be electrically connected with the fourth conductive member 927*b*.

According to an embodiment, the side member 910 may include a fifth conductive member 937*a* and a sixth conductive member 937*b* separated from each other by the third slit 933. The separation between the fifth conductive member 937*a* and the sixth conductive member 937*b* may be a separation between logical areas determined based on the third slit 933. The side member 910 may further include the third connection part 935 protruding toward the inner part of the housing from one area of the fifth conductive member 937*a* or the sixth conductive member 937*b*. For example, the third connection part 935 may protrude toward the inner part of the housing from an area of the sixth conductive member 937*b* that is adjacent to the third slit 933, and may be electrically connected with the sixth conductive member 937*b*.

According to an embodiment, the side member 910 may include a seventh conductive member 947*a* and an eighth conductive member 947*b* separated from each other by the fourth slit 943. The separation between the seventh conductive member 947*a* and the eighth conductive member 947*b* may be a separation between logical areas determined based on the fourth slit 943. The side member 910 may further include the fourth connection part 945 protruding toward the inner part of the housing from one area of the seventh conductive member 947*a* or the eighth conductive member 947*b*. For example, the fourth connection part 945 may protrude toward the inner part of the housing from an area of the eighth conductive member 947*b* that is adjacent to the fourth slit 943, and may be electrically connected with the eighth conductive member 947*b*.

Figure 10:
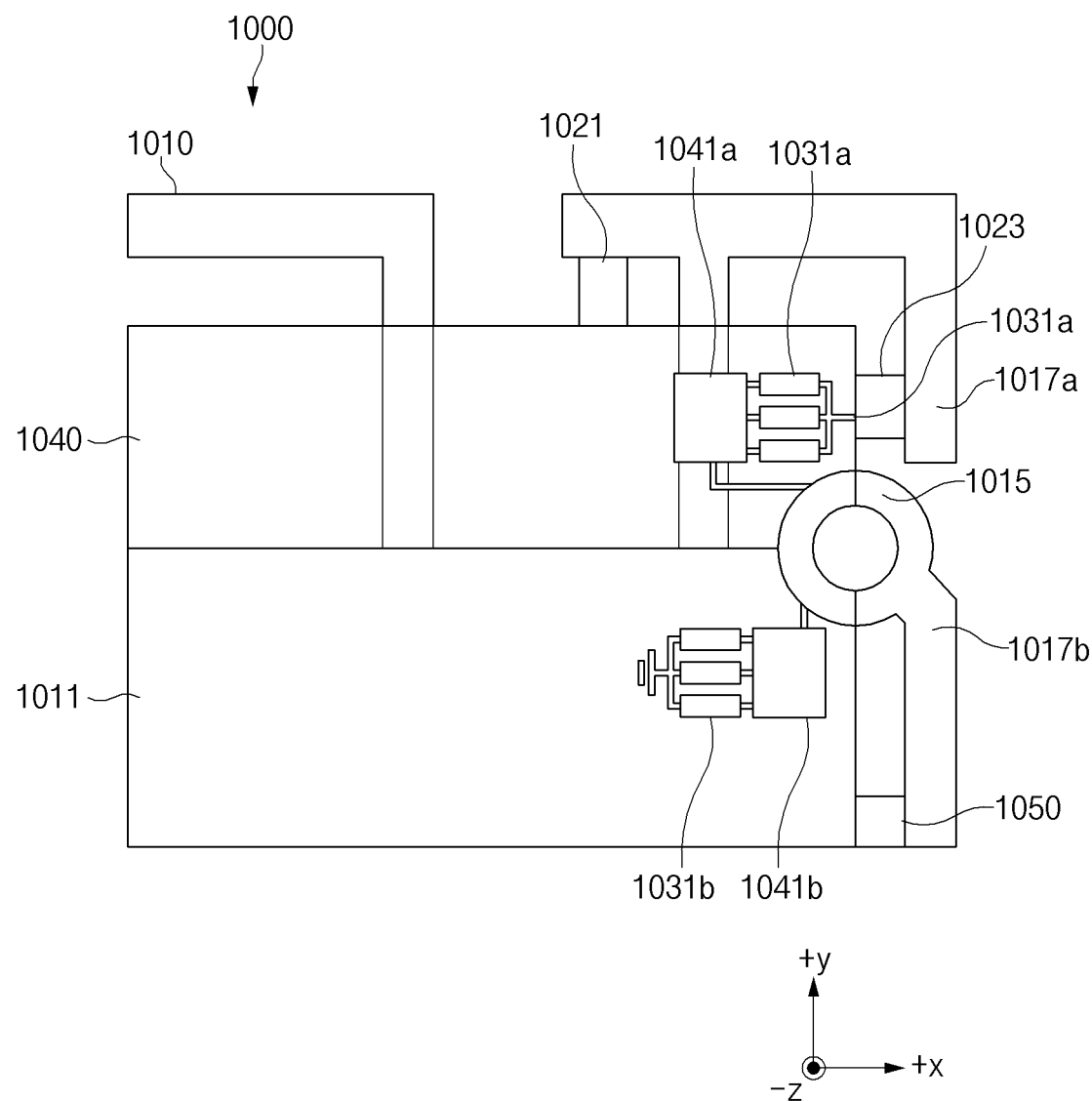
FIG. 10 illustrates a schematic view of an inner part of an electronic device including a switching circuit, according to an embodiment.

FIG. 10 illustrates a schematic view 1000 of an inner part of an electronic device including a switch, according to an embodiment.

Referring to FIG. 10, according to an embodiment, the electronic device (e.g., the electronic device 101 of FIG. 1) may include a support member 1011, a PCB 1040, a first power feeding part 1021, a second power feeding part 1023, a first passive device 1031a, a second passive device 1031b, a first switch 1041a, a second switch 1041b, and/or a grounding part 1050 provided inside a side member 1010 (e.g., the side member 610 of FIG. 6). The first switch 1041a and the second switch 1041b may, for example, perform the operation of changing an electrical connection structure by connecting different passive devices depending on the antenna resonance frequency required for a particular antenna operation. The first passive device 1031a and the second passive device 1031b may include, for example, one or more inductors or capacitors. At least some of the passive devices may correspond to a ground area of a connection part 1015.

According to an embodiment, the electronic device may include a first conductive member 1017a and a second conductive member 1017b separated from each other by a slit (e.g., the slit 613 of FIG. 6). The separation between the first conductive member 1017a and the second conductive member 1017b may be a separation between logical areas determined based on a slit. According to an embodiment, the electronic device may further include the connection part 1015 protruding toward an inner part of the housing from an area of the second conductive member 1017b that is adjacent to the slit, and the connection part 1015 may be electrically connected with the second conductive member 1017b. According to an embodiment, a wireless communication circuit (e.g., the wireless communication module 192 in FIG. 1) disposed on the PCB 1040 mounted on one surface of the support member 1011 may feed power into the first conductive member 1017a and/or the connection part 1015. For example, the first power feeding part 1021 may feed power into the first conductive member 1017a. In another example, the second power feeding part 1023 may feed power into the first conductive member 1017a and/or the connection part 1015. The connection part 1015 may be electrically connected to the second conductive member 1017b.

According to an embodiment, the electronic device may further include one or more switches 1041a and 1041b. For example, the first switch 1041a may be electrically connected with the first passive device 1031a and the connection part 1015. For example, the second switch 1041b may be electrically connected with the second passive device 1031b and the connection part 1015.

Figure 11:
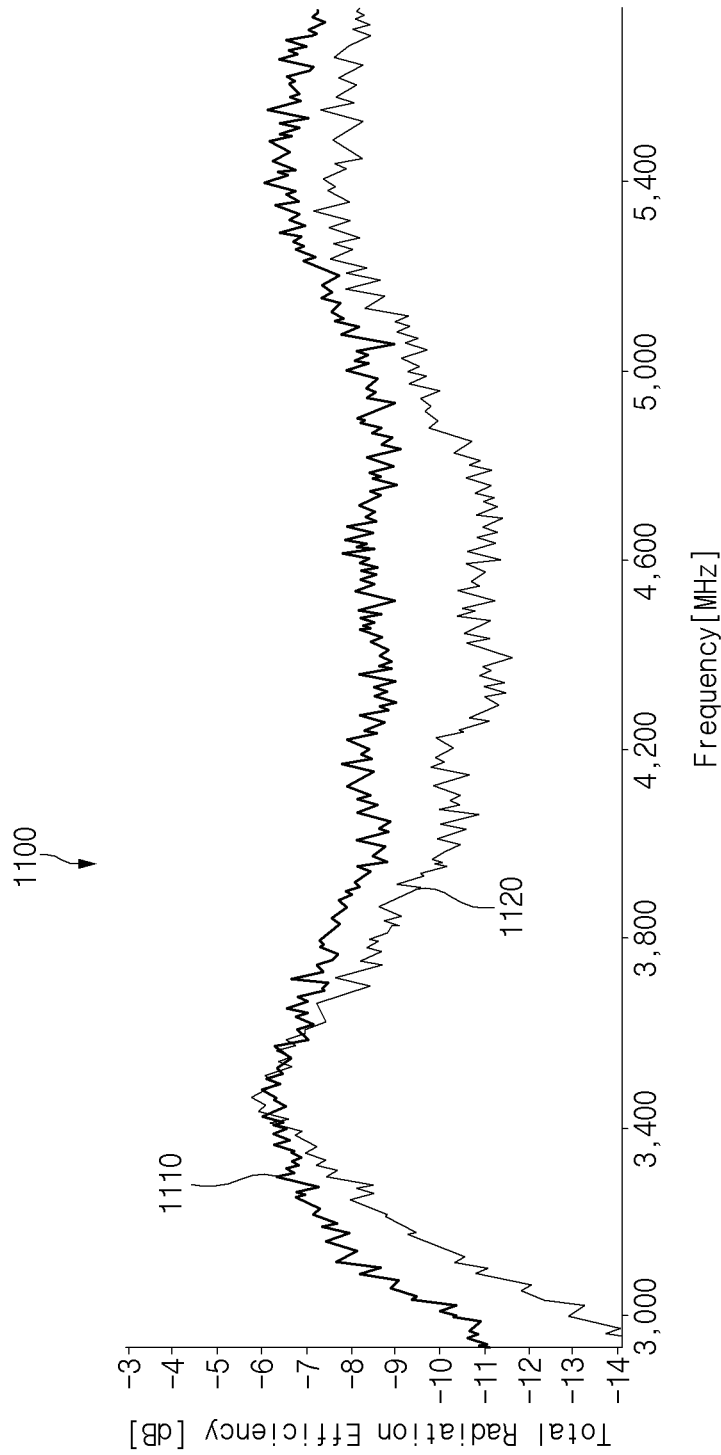
FIG. 11 illustrates a change in efficiency of a radiation function performed by an electronic device, according to an embodiment.

FIG. 11 is a graph 1100 showing a change in efficiency of a radiation function performed by an electronic device, according to an embodiment.

According to an embodiment, a curve indicated by reference numeral 1110 may represent the radiation efficiency measured by an electronic device (e.g., the electronic device 101 of FIG. 1) employing an internal specific structure (e.g., the connection part 415 of FIG. 4) of the housing as a radiator. A curve indicated by reference numeral 1120 may represent the radiation efficiency measured by a conventional electronic device having no such structure disclosed herein.

Referring to FIG. 11, according to an embodiment, it may be understood that the radiation efficiency may be increased in the entire portion of a frequency band (e.g., the frequency band of 3.0 GHz to 5.6 GHz) when the electronic device employs at least one connection part as a radiator. For example, it may be understood that the radiation efficiency measured by the electronic device having no structure disclosed herein is −14 dB, in the first frequency band (e.g., the frequency band of 3.0 GHz). Meanwhile, it may be understood that the radiation efficiency of the electronic device having a structure of the disclosure −11 dB in the first frequency band of 3.0 GHz, which indicates higher radiation efficiency.

According to various embodiments of the disclosure, an electronic device (e.g., the electronic device 101 of FIG. 1) may include a housing including a first plate (e.g., the front plate 420 of FIG. 4), which faces a first direction (e.g., the +Z axis direction), a second plate (e.g., the rear plate 480 of FIG. 4) which faces a second direction (e.g., the −Z axis direction of FIG. 4) opposite to the first direction, and a side member (e.g., the side member 410 of FIG. 4) including a first conductive member (e.g., the first conductive member 417a of FIG. 4) and a second conductive member (e.g., the second conductive member 417b of FIG. 4) which surround a space between the first plate and the second plate and are separated from each other by a slit (e.g., the slit 413 of FIG. 4), a support member (e.g., the support member 411 of FIG. 4) interposed between the first plate and the second plate, a printed circuit board (e.g., the PCB 440 of FIG. 4) disposed on a first surface of the support member, a wireless communication circuit disposed on the PCB, a display (e.g., the display 430 of FIG. 4) disposed on a second surface of the support member facing a direction opposite to a direction of the first surface of the support member and exposed through at least a portion of the first plate, a connection part (e.g., the connection part 415 of FIG. 4) protruding toward an inner part of the housing from an area of the second conductive member that is adjacent to the slit, the connection part being electrically connected with the second conductive member, and a coupling member coupled to the connection part while facing the first surface on which the PCB is disposed.

According to an embodiment, the wireless communication circuit may be configured to electrically connect the second conductive member and the connection part with an antenna circuit provided on the PCB.

According to an embodiment, a pad including a copper (Cu) pattern may be formed on at least a portion of an area of the PCB that makes contact with the connection part.

According to an embodiment, an anodizing film area may be included on at least a portion of a surface of the connection part.

According to an embodiment, the connection part may operate as a floating ground.

According to an embodiment, the coupling member may be a screw and may be screw-tightened with the connection part such that the coupling member faces the first direction.

According to an embodiment, the electronic device may further include a first matching circuit electrically connected with the first conductive member and the connection part.

According to an embodiment, the electronic device may further include a second matching circuit electrically connected with the second conductive member and a grounding area of the PCB.

According to an embodiment, the electronic device may further include a first switching circuit disposed on the PCB, and electrically connected with the first matching circuit and the connection part.

According to an embodiment, the electronic device may further include a second switching circuit disposed on the PCB, and electrically connected with the second matching circuit and the connection part.

According to an embodiment, the wireless communication circuit may selectively connect the connection part with the first matching circuit using the first switching circuit, and selectively connect the connection part with the second matching circuit using the second switching circuit.

According to an embodiment, the wireless communication circuit may feed power into a first point of a first end of the first conductive member that is adjacent to the slit.

According to an embodiment, the wireless communication circuit may feed power into a second point of the first conductive member that is adjacent to a second end opposite to the first end.

According to an embodiment, the support member may be physically coupled to at least one area of the side member, and the coupling member may be coupled to the connection part such that the PCB is fixed onto the support member.

According to various embodiments of the disclosure, an electronic device may include a side housing including a first conductive member and a second conductive member separated from each other by a slit, a PCB, and a wireless communication circuit disposed on the PCB. The second conductive member may include a connection part protruding from an area of the second conductive member that is adjacent to the slit, the connection part being electrically connected with the PCB, and the wireless communication circuit may be configured to electrically connect the second conductive member and the connection part with an antenna circuit provided on the PCB.

According to an embodiment, a pad including a copper (Cu) pattern may be formed on at least a portion of an area of the PCB that makes contact with the connection part, and the connection part may include an anodizing film area formed on at least a portion of a surface of the connection part such that the connection part is electrically separated from the PCB, and may operate as a floating ground.

According to an embodiment, the electronic device may further include a coupling member coupled to the connection part while facing a first surface on which the PCB is disposed, and the coupling member may be a screw and may be screw-tightened with the connection part.

According to an embodiment, the electronic device may further include a first matching circuit and a second matching circuit disposed on the PCB.

According to an embodiment, the first matching circuit may be electrically connected with the first conductive member, and the second matching circuit may be electrically connected with the second conductive member.

According to an embodiment, the electronic device may further include a first switching circuit disposed on the PCB and electrically connected with the first matching circuit and the connection part, and a second switching circuit disposed on the PCB and electrically connected with the second matching circuit and the connection part. The wireless communication circuit may selectively connect the connection part with the first matching circuit and the second matching circuit using the first switching circuit and the second switching circuit.

According to an embodiment, the wireless communication circuit may feed power into a first point of a first end of the first conductive member that is adjacent to the slit, and feeds power into a second point of the first conductive member that is adjacent to a second end opposite to the first end.

As described above, according to certain embodiments, the antenna performance of the electronic device may be improved while the sufficient number of slits included in the housing is maintained.

As at least one connection part, which protrudes inward from one end of the housing, which is split through the slit, is utilized as the radiator. This way, the mounting space of the electronic device for its antennas may be easily ensured. In addition, the function of the antenna operating based on a carrier aggregation (CA) technology may be performed without unnecessary trade-offs.

Besides, a variety of effects directly or indirectly understood through the disclosure may be provided.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a housing including a first plate, which faces a first direction, a second plate which faces a second direction opposite to the first direction, and a side member including a first conductive member and a second conductive member which substantially surrounds a space between the first plate and the second plate and are separated from each other by a slit;
a support member interposed between the first plate and the second plate;
a printed circuit board (PCB) disposed on a first surface of the support member;
a display disposed on a second surface of the support member, the display facing a direction opposite to a direction of the first surface of the support member, and the display being exposed through at least a portion of the first plate;
wherein the second conductive member includes a connection portion protruding toward an inner part of the housing from an area of the second conductive member that is adjacent to the slit, the connection portion being electrically connected with the second conductive member; and
a coupling member coupled to the connection portion,
wherein a wireless communication circuit provided on the PCB is electrically connected to the first conductive member and to the second conductive member through the connection portion, and
wherein the first conductive member at least partially forms an antenna with the second conductive member.

2. The electronic device of claim 1, wherein a pad including a copper (Cu) pattern is formed on at least a portion of an area of the PCB that makes contact with the connection portion.

3. The electronic device of claim 1 wherein an anodizing film area is included on at least a portion of a surface of the connection portion.

4. The electronic device of claim 3, wherein the connection portion operates as a floating ground.

5. The electronic device of claim 1, wherein the coupling member is a screw and is screw-tightened with the connection portion.

6. The electronic device of claim 1,
wherein the wireless communication circuit includes a first matching circuit electrically connected with the first conductive member and the connection portion.

7. The electronic device of claim 6,
wherein the wireless communication circuit includes a second matching circuit electrically connected with the second conductive member and a grounding area of the PCB.

8. The electronic device of claim 7, further comprising:
a first switching circuit disposed on the PCB, the first switching circuit configured to selectively electrically connect the first matching circuit to the connection portion.

9. The electronic device of claim 8, further comprising:
a second switching circuit disposed on the PCB, the second switching circuit configured to selectively electrically connected the second matching circuit to the connection portion.

10. The electronic device of claim 1, wherein the wireless communication circuit is configured to feed at a first point of a first end of the first conductive member that is adjacent to the slit.

11. The electronic device of claim 10, wherein the wireless communication circuit is configured to feed at a second point of a second end of the first conductive member, the second end opposite to the first end.

12. The electronic device of claim 1, wherein the support member is physically coupled to at least one area of the side member, and
wherein the coupling member is coupled to the connection portion such that the PCB is fixed onto the support member.

13. An electronic device comprising:
a side housing including a first conductive member and a second conductive member separated from each other by a slit;
a support member;
a PCB disposed on the support member;
wherein the second conductive member includes a connection part protruding from an area of the second conductive member that is adjacent to the slit, the connection part being physically coupled with the PCB and the support member by the coupling member, and
wherein a wireless communication circuit provided on the PCB is electrically connected and configured to feed power to the first conductive member and to the second conductive member through the connection part, and
wherein the first conductive member at least partially forms an antenna with the second conductive member.

14. The electronic device of claim 13, wherein a pad including a copper (Cu) pattern is formed on at least a portion of an area of the PCB that makes contact with the connection part, and
wherein the connection part includes an anodizing film area formed on at least a portion of a surface of the connection part such that the connection part is electrically separated from the PCB, and operates as a floating ground.

15. The electronic device of claim 13,
wherein the coupling member is a screw tightened to the connection part.

16. The electronic device of claim 13, further comprising:
a first matching circuit electrically connected with the first conductive member; and
a second matching circuit electrically connected with the second conductive member.

17. The electronic device of claim 16, further comprising:
a first switching circuit disposed on the PCB and configured to selectively electrically connect the first matching circuit to the connection part; and
a second switching circuit disposed on the PCB and configured to selectively electrically connect the second matching circuit to the connection part.

18. The electronic device of claim 13, wherein the wireless communication circuit is configured to feed at a first point of a first end of the first conductive member that is adjacent to the slit, and feed at a second point of the first conductive member that is adjacent to a second end opposite to the first end.

* * * * *

UNITED STATES PATENT AND TRADEMARK OFFICE
CERTIFICATE OF CORRECTION

| | | |
|---|---|---|
| PATENT NO. | : 11,785,709 B2 | Page 1 of 1 |
| APPLICATION NO. | : 17/368906 | |
| DATED | : October 10, 2023 | |
| INVENTOR(S) | : Sungwon Kim et al. | |

It is certified that error appears in the above-identified patent and that said Letters Patent is hereby corrected as shown below:

On the Title Page

Item (54) and in the Specification, Column 1, Lines 1-2, should read as follows:
ANTENNA MODULE AND ELECTRONIC DEVICE INCLUDING THE SAME In the Claims Column 24, Claim 13, between Line 5 and Line 6:
--"a coupling member; and"-- should be added Signed and Sealed this
Fourteenth Day of November, 2023

*Katherine Kelly Vidal*
Katherine Kelly Vidal
*Director of the United States Patent and Trademark Office*